United States Patent
Park et al.

(10) Patent No.: US 8,697,318 B2
(45) Date of Patent: Apr. 15, 2014

(54) METHOD OF FORMING PHOTOMASKS AND PHOTOMASKS FORMED BY THE SAME

(75) Inventors: Jongju Park, Hwaseong-si (KR); Sang Hyun Kim, Daejeon (KR); Donggun Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 39 days.

(21) Appl. No.: 13/602,598

(22) Filed: Sep. 4, 2012

(65) Prior Publication Data

US 2013/0122404 A1 May 16, 2013

(30) Foreign Application Priority Data

Nov. 15, 2011 (KR) .................. 10-2011-0118648

(51) Int. Cl.
*G03F 1/22* (2012.01)
*G03F 1/24* (2012.01)

(52) U.S. Cl.
USPC .............................................. 430/5; 430/319

(58) Field of Classification Search
USPC ......................................... 430/5, 319; 378/35
See application file for complete search history.

(56) References Cited

U.S. PATENT DOCUMENTS

| 7,247,412 B2 | 7/2007 | Lee |
| 7,601,467 B2 | 10/2009 | Huh et al. |
| 2010/0068632 A1* | 3/2010 | Ono et al. ............. 430/5 |
| 2011/0165504 A1 | 7/2011 | Ikuta |

FOREIGN PATENT DOCUMENTS

JP 2011044520 3/2011

* cited by examiner

*Primary Examiner* — Stephen Rosasco
(74) *Attorney, Agent, or Firm* — Volentine & Whitt, PLLC

(57) ABSTRACT

A method of manufacturing a photomask includes forming a multi-layer on a substrate and a blank layer on the multi-layer, patterning the blank layer to form openings exposing the multi-layer on a projection region of the substrate, and irradiating at least a portion of the multi-layer exposed by the openings with pulses of light output by a pulse laser whose pulse width is substantially greater than 0.001 seconds. Thus, the photomask has a reflective layer that includes a low-reflectance part corresponding to that part of the multi-layer irradiated by the light output by the pulse laser.

15 Claims, 9 Drawing Sheets

Region N

Region R

METHOD OF FORMING PHOTOMASKS AND PHOTOMASKS FORMED BY THE SAME

PRIORITY STATEMENT

This U.S. non-provisional patent application claims priority under 35 U.S.C. §119 to Korean Patent Application No. 10-2011-0118648, filed on Nov. 15, 2011, the entirety of which is hereby incorporated by reference.

BACKGROUND

The inventive concept relates to photolithography. More particularly, the inventive concept relates to photomasks and to methods of forming photomasks.

The fabricating of semiconductor devices entails the forming of fine patterns on a semiconductor substrate using lithographic techniques in which light is projected through a photomask and onto a photosensitive layer on a substrate. The photomask has a pattern corresponding to that to be formed on the substrate. Thus, the photosensitive layer on the substrate is exposed to an image of the photomask pattern. After the exposure process, the photosensitive layer is developed to "pattern" the layer. The patterned photosensitive layer may then be used as a mask during an etching process in which that portion of the substrate or layer exposed by the photosensitive pattern is removed.

For semiconductor devices to evolve and offer greater performance on a smaller scale, finer and finer patterns must be formed. To this end, light of increasingly shorter wavelengths is being used in lithography. For example, the most common light sources once used in lithography processes generated light whose wavelength was either that of the G-line (436 nm) or I-line (365 nm). However, recently, lithography processes are being carried out using light of a wavelength in the deep ultraviolet or extreme ultraviolet (EUV) band.

Meanwhile, EUV lithography processes are generally performed using a reflective optical system, as opposed to a refractive optical system, because the light of the EUV band is absorbed by most refractive optical materials. Thus, research into various methods of controlling the reflectance of the EUV photomask has been conducted with an aim towards reducing the critical dimension, such as line width, of the pattern that can be formed on a substrate by EUV lithography.

SUMMARY

According to an aspect of the inventive concept, there is provided a method of manufacturing a photomask in which a multi-layered structure of a plurality of stacked layers stacked is formed on a substrate, a blank layer is formed on the multi-layered structure, the blank layer is patterned to form openings which expose the multi-layered structure on a projection region of the substrate, and at least a portion of the multi-layered structure, exposed by the openings, is irradiated with pulses of light generated by a pulse laser and each lasting (i.e., having a pulse width) substantially greater than 0.001 seconds.

According to another aspect of the inventive concept there is provided a method of manufacturing a photomask in which a mask substrate having a projection region and a light shading region is provided, layers of first and second materials, respectively, are formed alternately one atop the other on the substrate so as to constitute a multi-layered structure on the mask substrate, a blank layer is formed on the multi-layered structure, and the blank layer is patterned to form openings which expose the multi-layered structure over the projection region of the mask substrate, and the reflectance of at least a portion of the multi-layered structure over the projection region of the mask substrate is modified by irradiating the multi-layered structure with pulses of laser light, and in which the index of refraction of the first material of the multi-layered structure is different from the index of refraction of the second material, and the pulses of the laser light each last substantially greater than 0.001 seconds.

According to still another aspect of the inventive concept there is provided a photomask comprising a substrate having a projection region and a light shading region, a reflective layer disposed on the substrate and comprising a multi-layered high-reflection part on the light shading and projection regions of the substrate and a multi-layered low-reflection part on the projection region and whose average reflectance of is substantially lower than that of the high-reflection part, a light shading pattern covering the entirety of the high-reflection part over the light shading region of the substrate, and a blank pattern disposed on the high-reflection part over the projection region of the substrate and including a first opening exposing a portion of the high-reflection part and a second opening exposing the low-reflection part.

BRIEF DESCRIPTION OF THE DRAWINGS

The inventive concept will become more apparent in view of the attached drawings and accompanying detailed description.

DETAILED DESCRIPTION OF THE PREFERRED EMBODIMENTS

Figure 1:
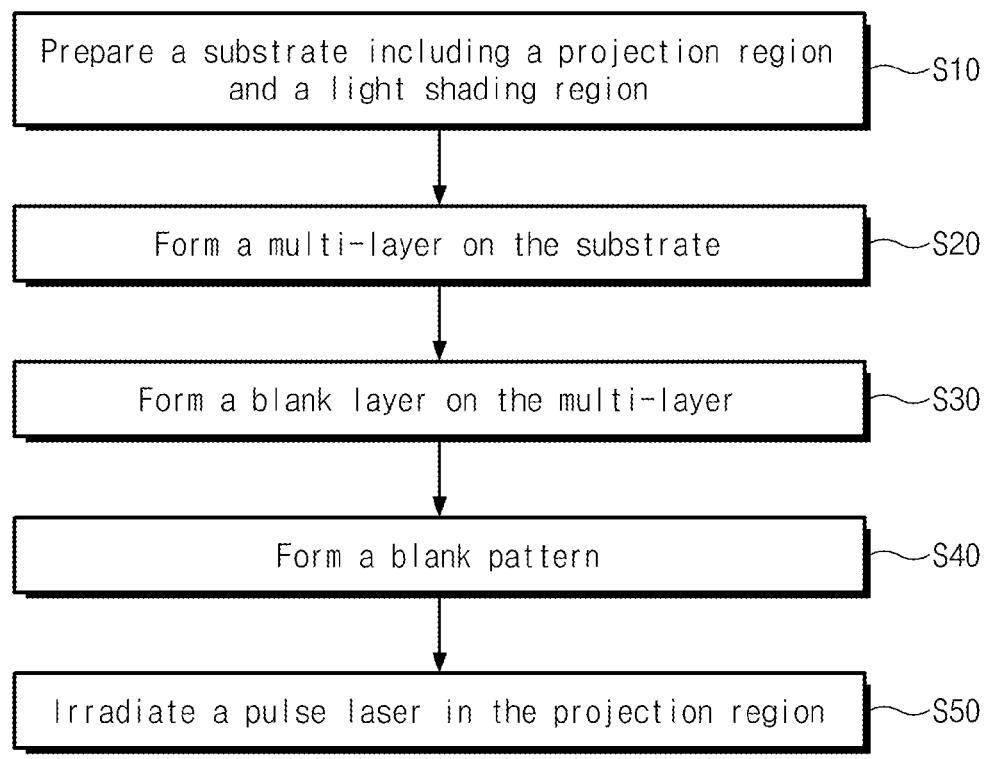
FIG. 1 is a flow chart of a method of forming a photomask according to the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the photomask and intermediate structures fabricated during the course of its manufacture are schematic. Also, like numerals are used to designate like elements throughout the drawings.

It will also be understood that when an element or layer is referred to as being "on" another element or layer, it can be directly on the other element or layer or intervening elements or layers may be present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The terms "over" and "on" are generally used to described relative orientations or positions. Thus, the elements or layers keep these relative orientations despite assuming different actual positional or spatial relationships when in use.

Hereinafter, photomasks and methods of manufacturing the same according to the inventive concept will be described with reference to the drawings.

Figure 2A:
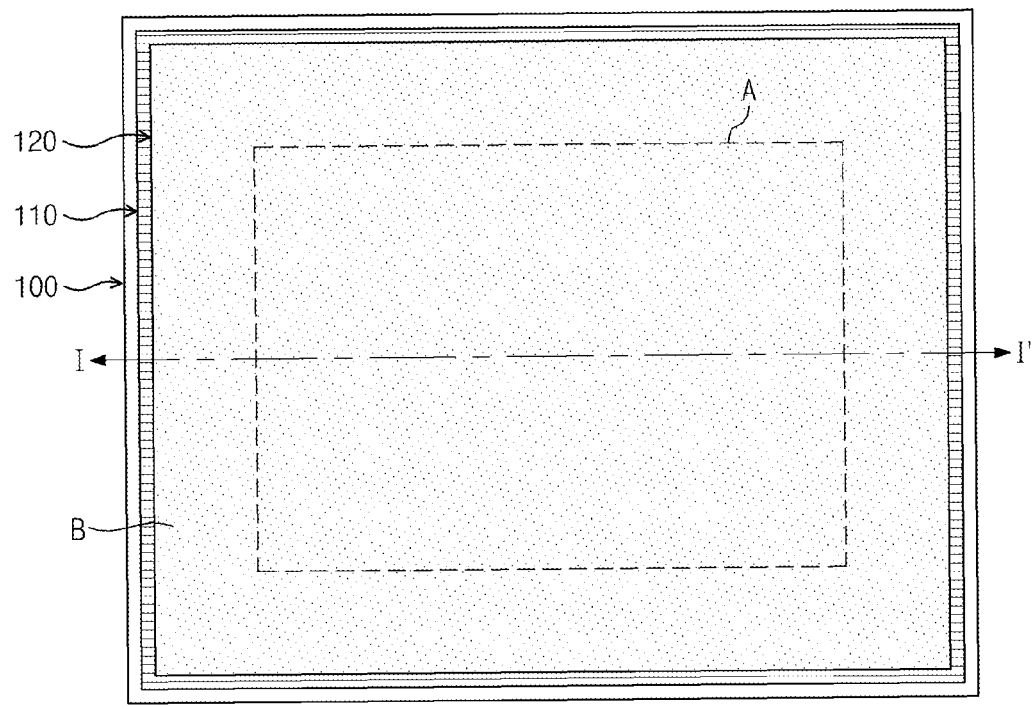
FIG. 2A is a plan view of a structure from which a photomask is fabricated according to the inventive concept.
Figure 2B:
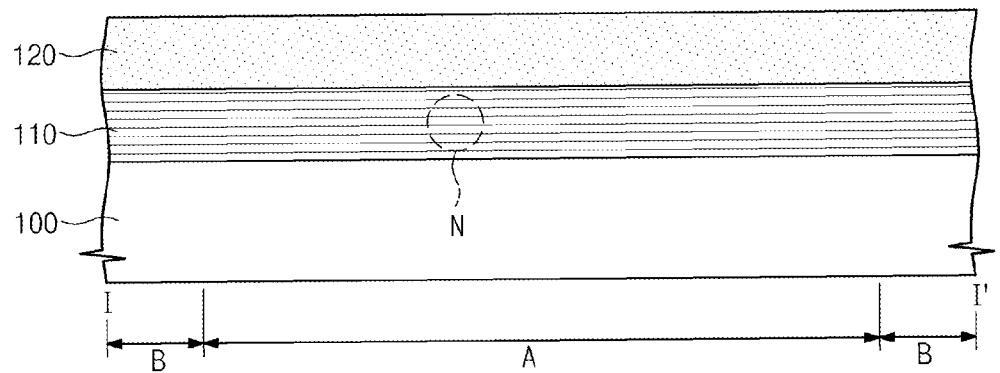
FIG. 2B is a cross-sectional view taken along a line I-I' of FIG. 2A.

Referring to FIGS. 1, 2A, and 2B, a substrate 100 including a projection region A and a light shading region B is provided (S10). The substrate 100 is preferably of a material having a low coefficient of thermal expansion, e.g., glass or silicon. The projection region A is that region from which light for forming a pattern of a semiconductor device is projected. The projection region A may be surrounded by the light shading region B. For example, as shown in FIG. 2A, the projection region A constitutes a central portion of the substrate 100, and the light shading region B constitutes an outer peripheral portion of the substrate 100.

Figure 2C:
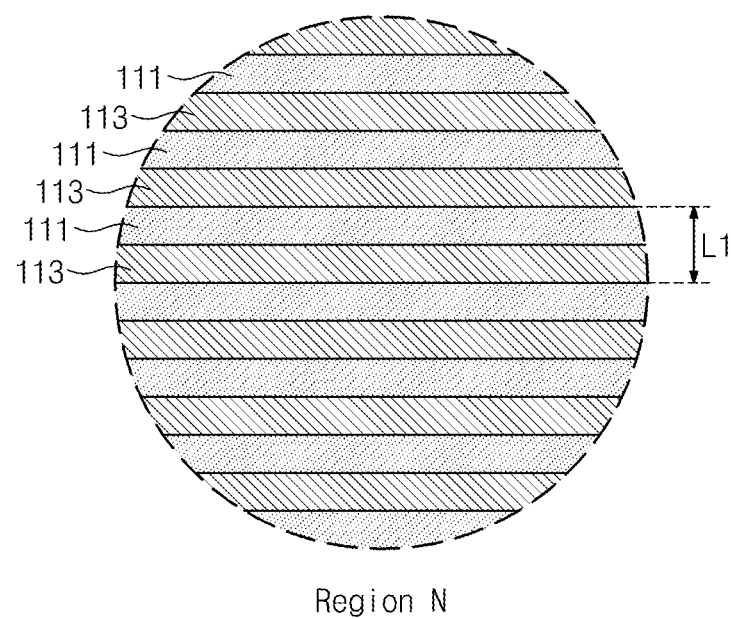
FIG. 2C is an enlarged view of a region N of a multi-layer of the structure shown in FIG. 2B.

A multi-layer 110 is formed on the substrate 100 (S20). Referring to FIG. 2C, the multi-layer 110 includes a plurality of thin layers constituting a Bragg reflector to improve the reflectance of extreme ultraviolet (EUV) radiation used in an EUV exposure process. That is, the multi-layer 110 is formed by alternately and repeatedly stacking first thin layers 111 having a first refractive index and second thin layers 113 having a second refractive index substantially smaller than the first refractive index. For example, each of the first thin layers 111 may be a silicon layer, and each of the second thin layers 113 may be a molybdenum layer. In the present embodiment, the total number of the first and second thin layers 111 and 113 is about 40 to about 60. Each of the first and second thin layers 111 and 113 constituting the multi-layer 110 may be formed by a magnetron sputtering method or an ion beam sputtering method.

Also, in the example of the present embodiment, the first thin layers 111 are thicker than the second thin layers 113. For example, the thickness of each of the first thin layers 111 is in a range of about 4.0 nm to about 4.1 nm, and the thickness of each of the second thin layers 113 is in a range of about 2.9 nm to about 3.0 nm. Therefore, in the present embodiment, the sum L1 of the thicknesses of respective ones of the first and second thin layers 111 and 113 is in a range of about 6.9 nm to 7.1 nm. However, the inventive concept is not limited to these ranges of thicknesses. The thicknesses of the first and second thin layers 111 and 113 will basically depend on the wavelength of the extreme ultraviolet (EUV) radiation used in the EUV process for which the photomask is designed.

Next, a blank layer 120 is formed on the multi-layer 110 (S30). In one example of this embodiment, the blank layer 120 is formed of a layer of material that absorbs, i.e., is substantially opaque with respect to, EUV radiation. For example, the blank layer 120 is a conductive layer such as a tantalum nitride (TaN) layer.

A buffer layer (not shown) may be formed before the blank layer 120 is formed so as to be interposed between the multi-layer 110 and the blank layer 120. In this case, the buffer layer may comprise a silicon nitride layer and/or a silicon oxide layer.

Figure 3:
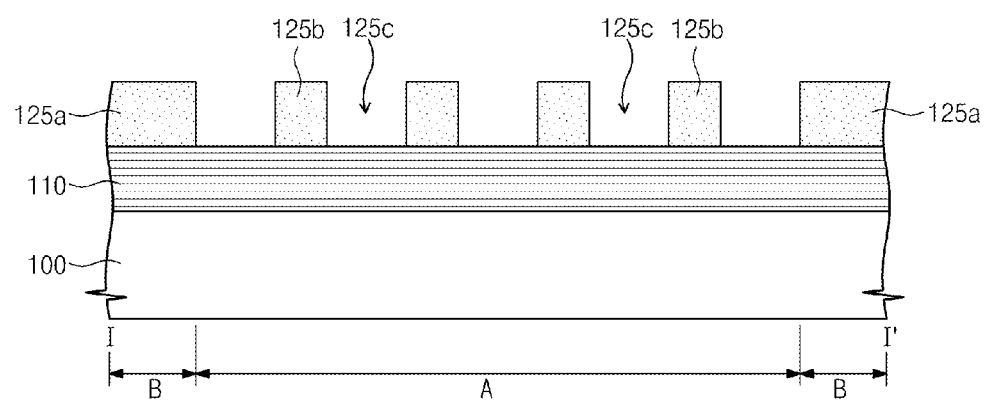
FIGS. 3, 4, and 5A are cross-sectional views illustrating a method of forming a photomask according to the inventive concept.

Referring to FIGS. 1 and 3, the blank layer 120 is then patterned (S40) to form a blank pattern 125b and a light shading pattern 125a. For example, a mask pattern may be formed on the blank layer 120 and then the blank layer 120 may be etched by a dry plasma etching process using the mask pattern as an etch mask. In this respect, the aforementioned buffer layer serves as an etch stop layer.

The light shading pattern 125a is formed on the light shading region B. In this embodiment, the light shading pattern 125a cover the entire light shading region B, and surrounds the projection region A as viewed in plan. On the other hand, the blank pattern 125b is formed on the projection region A. The blank pattern 125b defines openings 125c respectively exposing portions of the top surface of the multi-layer 110.

In another example of this embodiment, the blank layer 120 is formed of two layers of different materials, and the layers are respectively etched to form the light shading pattern 125a and the blank pattern 125b, respectively. Thus, in this case, the light shading pattern 125a and the blank pattern 125b are formed of different materials.

Figure 4:
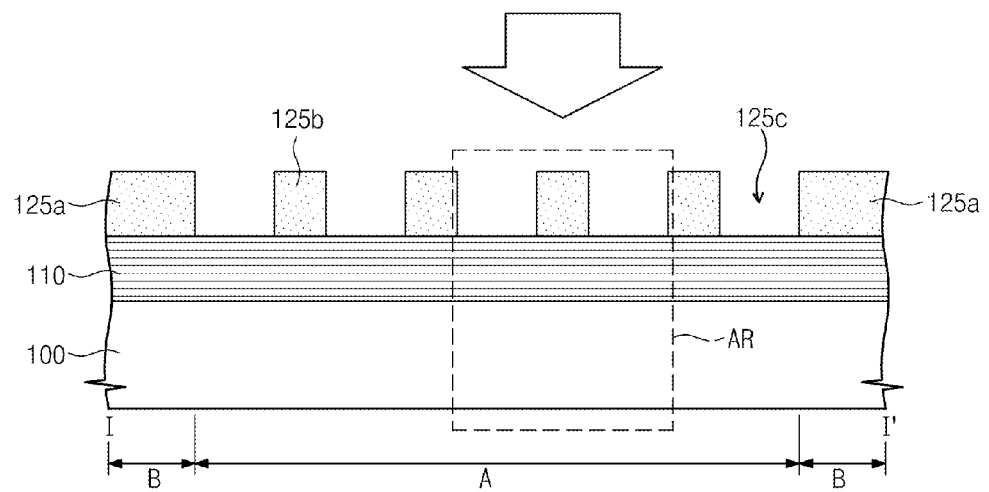
Figure 5A:
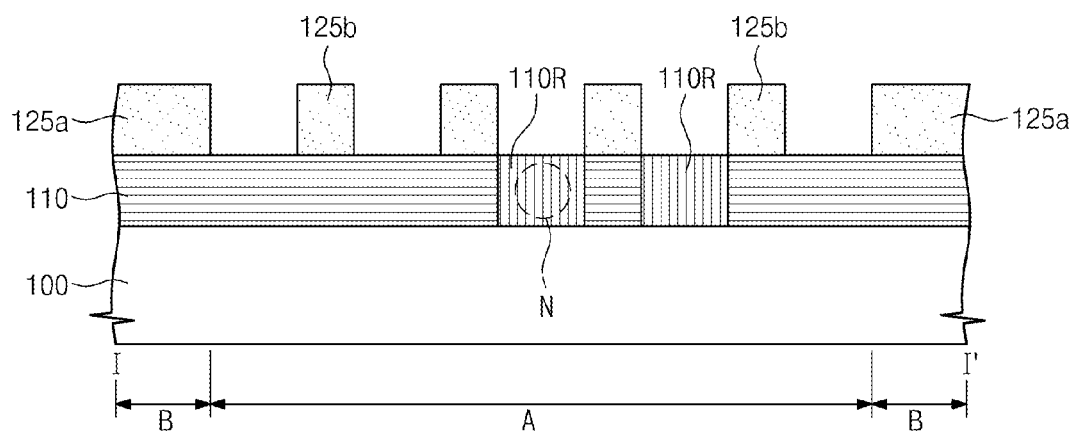

Referring to FIGS. 1, 4, and 5A, an amending region AR of the resulting structure is then irradiated with a pulse laser (S50). The amending region AR corresponds to a portion of the projection region A of the substrate 100. In this process, the pulse width (duration of the output of EUV radiation by the pulse laser) is substantially greater than 0.001 seconds. Accordingly, the temperature of the portion of the multi-layer 110 exposed by the openings 125c of the blank pattern 125b in the amending region AR is increased.

As a result, a low-reflection part 110R is formed in the multi-layer 110 as illustrated in FIG. 5A. The average reflectance of the low-reflection part 110R is substantially lower than the average reflectance of the remainder of the multi-layer 110, i.e., the non-irradiated part. In some cases, the average reflectance of the low-reflection part 110R may be inversely proportional to the intensity of the radiation output by the pulse laser or processing time that the pulse laser is used to irradiate the amending region AR. In other words, in some cases, the greater the intensity of the output of the pulse layer or the longer the processing time, the lower the average reflectance of the low-reflection part 110 becomes.

The forming of the low-reflection part 110R by the pulse laser will now be explained in more detail. When the temperature of the multi-layer 110 is increased by the pulse laser, an element constituting the first thin layer(s) 111 and an element constituting the second thin layer(s) 113 of the multi-layer 110 diffuse through an interface between the first thin layer 111 and the second thin layer 113, and combine. The refractive of the combined portion is less than the difference between the refractive index of the first thin layer and the refractive index of the second thin layer. Accordingly, as concerns the reflective layer of the photomask 200, the average reflectance of the low-reflection part 110R is substantially lower than that of the non-irradiated part of the multi-layer 110 (which non-irradiated part will be referred to hereinafter simply as the "multi-layer 110").

Figure 5B:
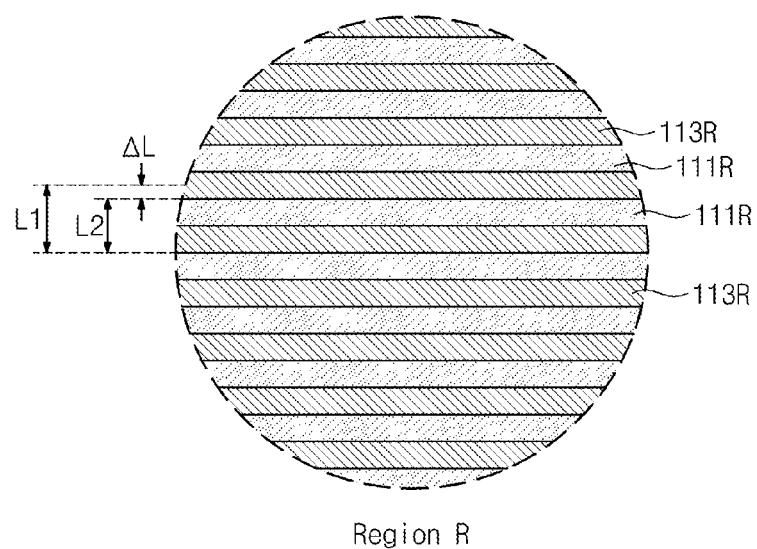
FIG. 5B is an enlarged view of a region R of the photomask shown in FIG. 5A.

Referring to FIG. 5B, the low-reflection part 110R includes first modified thin layers 111R and second modified thin layers 113R which are alternately and repeatedly stacked one atop the other. The sum L2 of the thickness of the first modified thin layer 111R and the thickness of the second modified thin layer 113R is substantially smaller than the sum L1 of the thicknesses of respective ones of the first and second thin layers 111 and 113. To this end, the thickness of the first modified thin layer 111R may be substantially less than the thickness of the first thin layer 111 and/or the thickness of the second modified thin layer 113R may be substantially less than the thickness of the second thin layer 113.

The pulse width of the pulse laser is selected to be substantially greater than 0.001 second so that thermal energy affects, i.e., is transferred to, at least a portion of a peripheral region around that irradiated by the pulse laser. As a result, the distribution (or variations in) the reflectance of a low-reflection part 110R of a photomask formed according to the inventive concept may have a standard deviation of substantially less than about 10%.

Figure 6A:
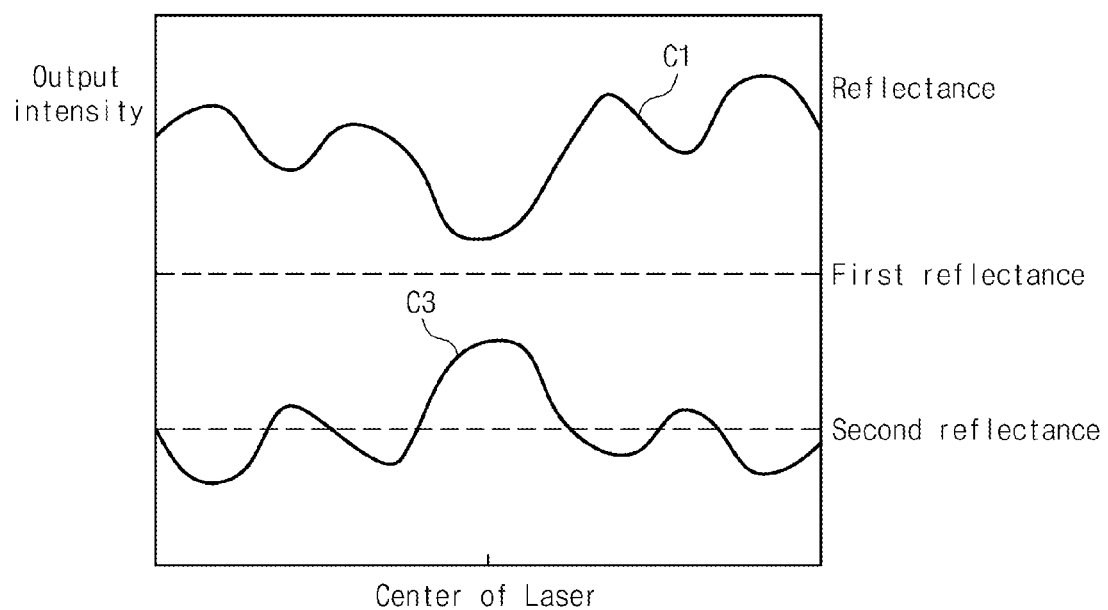
FIG. 6A is a graph of the transverse mode of a pulse laser whose output has a pulse width of substantially less than 0.001 seconds and the resulting reflectance of a portion of a multi-layer modified by irradiating the multi-layer with the pulse laser.

Test results which confirm are shown in and will be explained with reference to FIGS. 6A and 6B. FIGS. 6A and B are graphs showing changes of reflectance of multi-layers as the result of being irradiated by pulse lasers whose outputs have pulse widths of substantially less than 0.001 and substantially greater than 0.001, respectively. In the results shown in FIGS. 6A and 6B, the changes in reflectance occur basically due to the transverse mode of the pulse lasers. In this respect, the transverse mode refers to the distribution of the intensity of the laser output in a transverse plane, i.e., in a direction perpendicular to the direction in which the beam of the pulse laser propagates.

In FIG. 6A, the transverse mode (intensity of the radiation output in a transverse plane) of the pulse laser whose pulse width is substantially less than 0.001 second has a waveform C1, i.e., an irregular waveform. In this case, the low-reflection part formed by the pulse laser has a reflectance whose distribution has corresponding irregular form C3. That is, as shown in the graph, the transverse mode of the pulse laser and the reflectance distribution of the low-reflection part exhibit mirror symmetry.

Figure 6B:
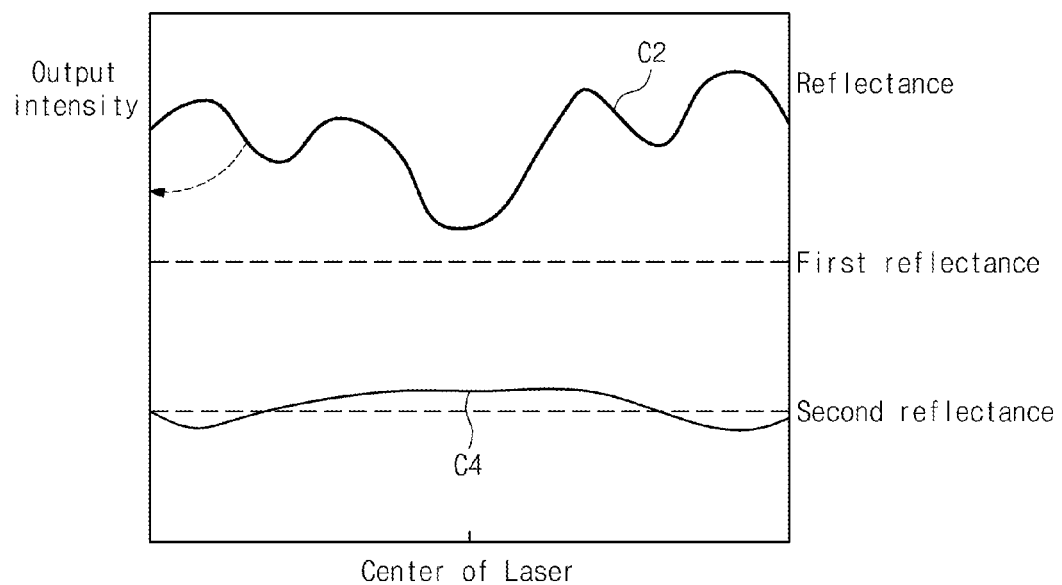
FIG. 6B is a graph of the transverse mode of a pulse laser whose output has a pulse width of substantially greater than 0.001 seconds and the resulting reflectance of a portion of a multi-layer modified by irradiating the multi-layer with the pulse laser in a method of fabricating a photomask according to the inventive concept.

In the graph of FIG. 6B, the transverse mode of the pulse laser whose pulse width is substantially greater than 0.001 second also has an irregular waveform C2. However, the low-reflection part 110R formed using this pulse laser has a reflectance whose distribution is characterized by fluent curves C4. As the results shown in the graphs of FIGS. 6A and 6B clearly show, the reflectance of the low-reflection part 110R formed using the pulse laser whose pulse width is substantially greater than 0.001 seconds is better than the reflectance of a low-reflection part formed using a similar pulse laser but whose pulse width is substantially less than 0.001 second. This is because the range over which the thermal energy diffuses when produced by a pulse laser whose pulse width is substantially greater than 0.001 second is substantially wider than the range over which the thermal energy diffuses when produced by a pulse laser whose pulse width is substantially less than 0.001 second.

A lithographic method of transcribing a pattern onto a semiconductor substrate 300, using a photomask according to the inventive concept, will be described with reference to FIG. 7.

Figure 7:
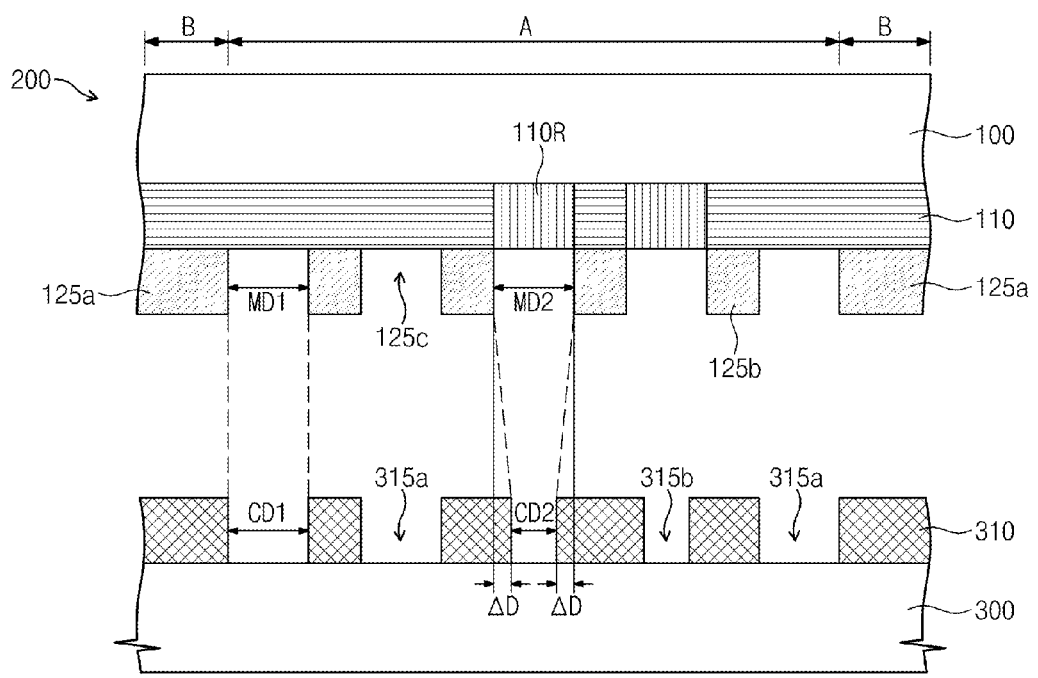
FIG. 7 is a cross-sectional view of a schematic representation of an exposure set up and illustrates a method of forming a pattern on a semiconductor substrate using a photomask according to the inventive concept.

Referring to FIG. 7, the photomask 200 according to the inventive concept includes substrate 100, multi-layer 110, light shading pattern 125a, blank pattern 125b, and low-reflection part 110R defined in multi-layer 110. As mentioned above, the reflectance distribution of the low-reflection part 110R may have a standard deviation of substantially less than about 10%.

The openings 125c in the blank pattern 125b include a first opening exposing a portion of the multi-layer 110 and a second opening exposing at least a portion of the low-reflection part 110R. In this example, the width MD1 of the first opening is substantially equal to the width MD2 of the second opening.

A first trench 315a and a second trench 315b are formed in a photoresist layer 310, disposed on the semiconductor substrate 300, by an optical system (not shown) using an EUV light source and equipped with the photomask 200. More specifically, EUV light generated by the EUV light source is directed onto the photoresist layer via the photomask 200 in an exposure process. In this exposure process, the EUV light generated by the light source and that is incident on the blank pattern 125b is absorbed by the blank pattern 125b. On the other hand, the EUV light that is incident on the multi-layer 110 and the low-reflection part 110R exposed by the first and second openings 125c, respectively, is reflected onto the photoresist layer 310. The physical and chemical properties of the portions of the photoresist 310 exposed to the EUV light reflected from the multi-layer 110 and the low-reflection part 110R are changed by the EUV light. However, the amount of the EUV light, which is reflected from the low-reflection part 110R, i.e., that part of the reflective layer having the low reflectance, is substantially less than the amount of EUV light which is reflected from the multi-layer 110, i.e., the part of the reflective layer having the relatively high reflectance.

In this embodiment, the exposed portions of the photoresist layer correspond to the first and second trenches 315a and 315b, respectively.

Therefore, a first portion of the photoresist layer 310 exposed to the EUV light reflected from the low-reflection part 110R is substantially smaller than a second portion of the photoresist layer 310 exposed to the EUV light reflected from the multi-layer 100. Then the photoresist layer 310 is developed to remove the exposed portions thereof. In this developing process, the photoresist layer 310 is rinsed in a developing solution which is able to remove the exposed portions—because of the differences in their chemical and physical properties from the non-exposed portions—and thereby form the first and second trenches 315a and 315b.

Thus, even though the width MD1 of the first opening of the photomask 200 is equal to the width MD2 of the second opening of the photomask 200, the width CD1 of the first trench 315a formed using the EUV light projected from the first opening is different from the width CD2 of the second trench 315b formed using the EUV light projected by the second opening. As shown in FIG. 7, the width CD2 less than the width CD1 by a value equal to two times ΔD.

Figure 8:
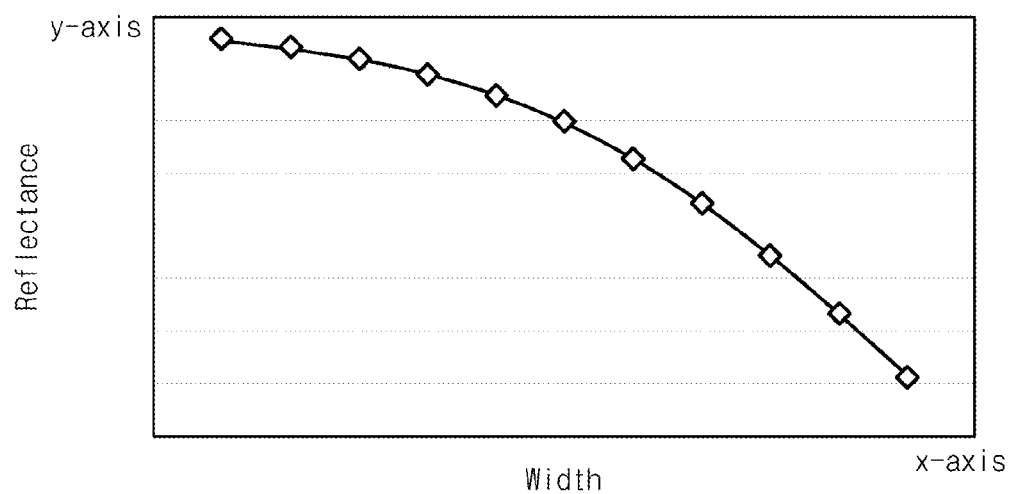
FIG. 8 is a graph illustrating a dependency between the width of a pattern transferred to a semiconductor substrate using a lithographic process and the reflectance of a photomask used in the lithographic process.

That is, the trench 315b formed on the semiconductor substrate using light reflected from the low-reflection part 110R is narrower, in a given direction, than the trench 315a formed using the light reflected from the multi-layer 110. The relationship between reflectance and pattern width is illustrated in FIG. 8.

According to the inventive concept as described above, a critical dimension of a pattern, such as a width of a trench, formed on a substrate using a lithographic process may be small even though an opening in a photomask used to form the pattern in the lithographic process remains rather wide. Thus, a photomask for the forming fine patterns on a semiconductor can be easily fabricated according to the inventive concept, i.e., the process margin of a method of fabricating a photomask according to the inventive concept is relatively large.

Additionally, the reflectance distribution of the low-reflection part 110R of the photomask 200 according to the inventive concept may have a standard deviation of substantially less than about 10%. Thus, the trenches (or other pattern) formed on a substrate by EUV light reflected from the low-reflection part 110R are highly uniform. Also, the trenches (or other pattern) may be formed with a high degree of reproducibility, and semiconductor devices with improved reliability may be realized.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a photomask, comprising:
    forming a multi-layered structure on a substrate, whereby the multi-layered structure consists of a plurality of layers stacked one atop the other;
    forming a blank layer on the multi-layered structure;
    patterning the blank layer to form openings which expose the multi-layered structure on a projection region of the substrate; and
    irradiating at least a portion of the multi-layered structure, exposed by the openings, with pulses of light generated by a pulse laser,
    wherein each of the pulses lasts substantially greater than 0.001 seconds.

2. The method of claim 1, wherein the forming of the multi-layered structure comprises forming layers of first and second materials, respectively, alternately one atop the other on the substrate, the index of refraction of the first material being different from the index of refraction of the second material.

3. The method of claim 2, wherein the irradiating of the at least a portion of the multi-layered structure comprises imparting sufficient thermal energy to said at least a portion of the multi-layered structure as to cause an element constituting the first material and an element constituting the second material to diffuse across an interface of the layers of the first and second materials.

4. The method of claim 1, wherein the irradiating of the at least a portion of the multi-layered structure comprises reducing the thickness of at least one of the layers of the first and second materials at said at least a portion of the multi-layered structure.

5. The method of claim 1, wherein the patterning of the blank layer comprises forming a light shading pattern that covers the multi-layered structure over the entirety of a light shading region of the substrate surrounding the projection region.

6. The method of claim 1, wherein the blank is patterned using a plasma dry etching process.

7. The method of claim 1, wherein the irradiating of the at least a portion of the multi-layered structure comprises reducing the average reflectance of said at least a portion of the multi-layered structure.

8. The method of claim 7, wherein the irradiating of the at least a portion of the multi-layered structure is characterized in that the average reflectance of said at least a portion of the multi-layered structure is inversely proportional to an average intensity of the light output by the pulse layer or the total time that said at least a portion of the multi-layered structure is irradiated.

9. The method of claim 7, wherein the irradiating of the at least a portion of the multi-layered structure is characterized in that the distribution of the intensity of the light output by the pulse laser, in a transverse plane and direction perpendicular to that in which the light propagates toward the substrate as it is irradiating the at least a portion of the multi-layered structure, has a standard deviation,
    the distribution of the reflectance of said at least a portion of the multi-layered structure, in said direction perpendicular to that in which the light propagates toward the substrate, has a standard deviation, and
    the standard deviation of said distribution of the reflectance is substantially smaller than the standard deviation of said distribution of the intensity of the light output by the pulse laser.

10. A method of manufacturing a photomask, comprising:
    providing a mask substrate having a projection region and a light shading region;
    forming layers of first and second materials, respectively, alternately one atop the other on the substrate, the index of refraction of the first material being different from the index of refraction of the second material, whereby the layers constitute a multi-layered structure on the mask substrate;
    forming a blank layer on the multi-layered structure, and patterning the blank layer to form openings which expose the multi-layered structure over the projection region of the mask substrate, and
    modifying the reflectance of at least a portion of the multi-layered structure over the projection region the mask substrate by irradiating the multi-layered structure with pulses of laser light each lasting substantially greater than 0.001 seconds.

11. The method of claim 10, wherein the patterning of the blank layer comprises forming a light shading pattern that covers the multi-layered structure over the entirety of a light shading region of the substrate surrounding the projection region.

12. The method of claim 10, wherein the blank is patterned using a plasma dry etching process.

13. The method of claim 10, wherein the irradiating of the multi-layered structure comprises irradiating the multi-layered structure through only some of the openings of the patterned blank layer, whereby the reflectance of only part of the multi-layered structure over the projection region of the substrate is modified.

14. The method of claim 10, wherein the forming of the blank on the multi-layered structure comprises forming a layer that is substantially opaque with respect to extreme ultraviolet (EUV) light, and the forming of the first and second layers of material as the multi-layered structure comprises alternately forming layers of silicon and molybdenum on the mask substrate.

15. A lithographic method comprising providing a photomask manufactured according to the method as claimed in claim 10, and wherein the blank pattern is formed of material that is substantially opaque with respect to extreme ultraviolet (EUV) light, and the portion of the multi-layered structure modified by the laser light is reflective with respect to EUV light;
    providing a semiconductor substrate having a layer of photoresist thereon;
    directing EUV light onto the multi-layered structure of the photomask exposed by the openings of the patterned blank layer in such a way that the EUV light reflects from the modified portion of the multi-layered structure through the openings of the patterned blank layer and onto the photosensitive layer, thereby exposing the photosensitive layer to the EUV light; and subsequently removing portions of the photosensitive layer by developing the photosensitive layer exposed to the EUV light.

* * * * *